United States Patent [19]
Kotter et al.

[11] Patent Number: 5,317,259
[45] Date of Patent: May 31, 1994

[54] DC-BASED MAGNETIC FIELD CONTROLLER

[75] Inventors: Dale K. Kotter, Shelley; Richard A. Rankin, Ammon; John P,. Morgan, Idaho Falls, all of Id.

[73] Assignee: The United States of America as represented by the United States Department of Energy, Washington, D.C.

[21] Appl. No.: 522,877

[22] Filed: May 14, 1990

[51] Int. Cl.$^5$ .................... G01N 27/72; G01R 33/12; G01R 33/06
[52] U.S. Cl. .................... 324/251; 324/228; 324/226
[58] Field of Search ............ 324/235, 251, 225, 226, 324/228; 250/299; 361/143, 146; 307/309; 338/32 H

[56] References Cited

U.S. PATENT DOCUMENTS

| | | | |
|---|---|---|---|
| 3,080,507 | 3/1963 | Wickerham et al. | 324/225 |
| 3,416,073 | 12/1968 | Gutow, Jr. | 324/251 |
| 3,597,679 | 8/1971 | Habfast | 324/251 |
| 4,613,818 | 9/1986 | Battocletti et al. | 324/320 |

OTHER PUBLICATIONS

Buncick et al., "Computer controlled method for removal of stray magnetic fields", 8127 Review of Scientific Inst. vol. 54 (1983) Jan., No. 1 pp. 100–103.

*Primary Examiner*—Walter E. Snow
*Attorney, Agent, or Firm*—Tyrone Davis; Thomas G. Anderson; William R. Moser

[57] ABSTRACT

A magnetic field controller for laboratory devices and in particular to dc operated magnetic field controllers for mass spectrometers, comprising a dc power supply in combination with improvements to a hall probe subsystem, display subsystem, preamplifier, field control subsystem, and an output stage.

7 Claims, 1 Drawing Sheet

DC-BASED MAGNETIC FIELD CONTROLLER

CONTRACTUAL ORIGIN OF THE INVENTION

The United States Government has rights in this invention pursuant to Contract No. DE-AC07-84ID12435 between the United States Department of Energy and Westinghouse Electric Company.

BACKGROUND OF THE INVENTION

The present invention relates to magnetic field controllers and in particular to a dc operated magnetic field controller of the magnet subsystem of mass spectrometers. The controller provides magnetic field measurement and field control of the mass spectrometer electromagnet.

Mass scanning on a mass spectrometer may be performed by varying the electromagnetic field of a large magnet. A magnetic field controller, with a hall effect sensor, controls the magnetic field and compensates for magnet hysteresis. The current technology used in the design of laboratory field regulated magnet systems is based on the alternating current (ac) design techniques. These ac based designs require complex circuitry to provide signal chopping, amplification, synchronous demodulation of the signal, and appropriate filter circuitry to remove the undesired ac components. This approach was required to provide stable, high gain, drift free hall sensor voltage amplification.

The mass analyzer of the mass spectrometer is built around a large electromagnet. Mass scanning is performed by varying the magnetic field. To vary the magnetic field the amount of current flowing through the magnet windings is changed. The magnet power supply is the source of the unregulated current. The current is conditioned and regulated by the magnet power supply regulator. Additional field regulation is required for precision analysis. This field regulation is provided by the magnetic field controller. The magnetic field controller is used in the feedback loop with the magnet power supply regulator to correct for magnetic hysteresis and other errors in the current regulation.

The function of the magnetic field controller can be described as follows. When the field control potentiometer setting is changed, the magnetic field controller senses an unbalance condition in the magnetic feedback loop and generates an error voltage, the power supply regulator modifies the current flowing through the magnet and the magnetic field is changed. The output of the hall probe senses the change in the magnetic field and compares it to the desired field as set with the field control potentiometer. The error voltage approaches zero as the actual magnetic field approaches the desired field and a balanced condition returns. The time required for the magnetic field to stabilize after adjusting the field control potentiometer is primarily dependent upon the magnet time constant—usually 2 to 3 seconds. Until recently, these required parameters were not easily obtained with integrated circuit operational amplifiers.

SUMMARY OF THE INVENTION

The present invention relates to the magnetic field controller of laboratory devices and in particular to dc operated magnetic field controllers for mass spectrometers.

The invention takes advantage of advances in dc-based operational amplifier technology. Design goals include the capability to interface to a computer-controlled data system for automated scanning of the magnetic spectrum, as well as the ability to operate in a manual control mode. For high precision analysis the magnetic field requires that it be controllable to 0.1 gauss resolution with a stability factor of ±0.05 gauss. Recent state of the art developments in low noise, drift free, integrated operational amplifiers have made it possible to achieve or exceed the performance of ac powered techniques.

The present invention is compatible with a variety of magnet control systems, therefore, the unit incorporates gain and frequency compensation circuitry. The output of the field controller is designed to interface with and control a magnet source with a ±10 Vdc control signal. Circuitry is provided for operating the controller in either a low or high gain mode to accommodate selected magnet characteristics. In the low gain mode the overall loop gain is about 2000. In the high gain mode the overall loop gain is approximately 40000. This makes it possible for the controller to be set up for optimum gain versus frequency response characteristics.

It is therefore an object of the invention to provide a field controller for devices that use magnetic fields, and further, to provide a dc powered magnetic field controller that can operate in a manual and automatic mode.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the invention contemplates a magnetic field controller comprising a dc power supply in combination with improvements to a hall probe subsystem, display subsystem, preamplifier, field control subsystem, and an output stage. The magnetic field controller design is based on state-of-the-art technology. Moreover, the use of dc operational amplifiers has greatly reduced the complexity of the design, while at the same time, the use of a galvanically isolated and thermally stabilized hall generator power supply increased the stability of the field regulation. Furthermore, integrated compensation circuitry has made it possible to tailor the controller to specific magnet load characteristics. Thus, by using dc technology, a magnetic field controller with improved reliability and improved maintainability has been conceived and developed at greatly reduced manufacturing costs.

BRIEF DESCRIPTION OF THE DRAWINGS

The accompanying drawing, which is incorporated in and form part of the specification, illustrate an embodiment of the of the present invention and together with the description, serve to explain the principles of the invention. In the drawing.

DETAILED DESCRIPTION OF THE INVENTION

Figure 1:
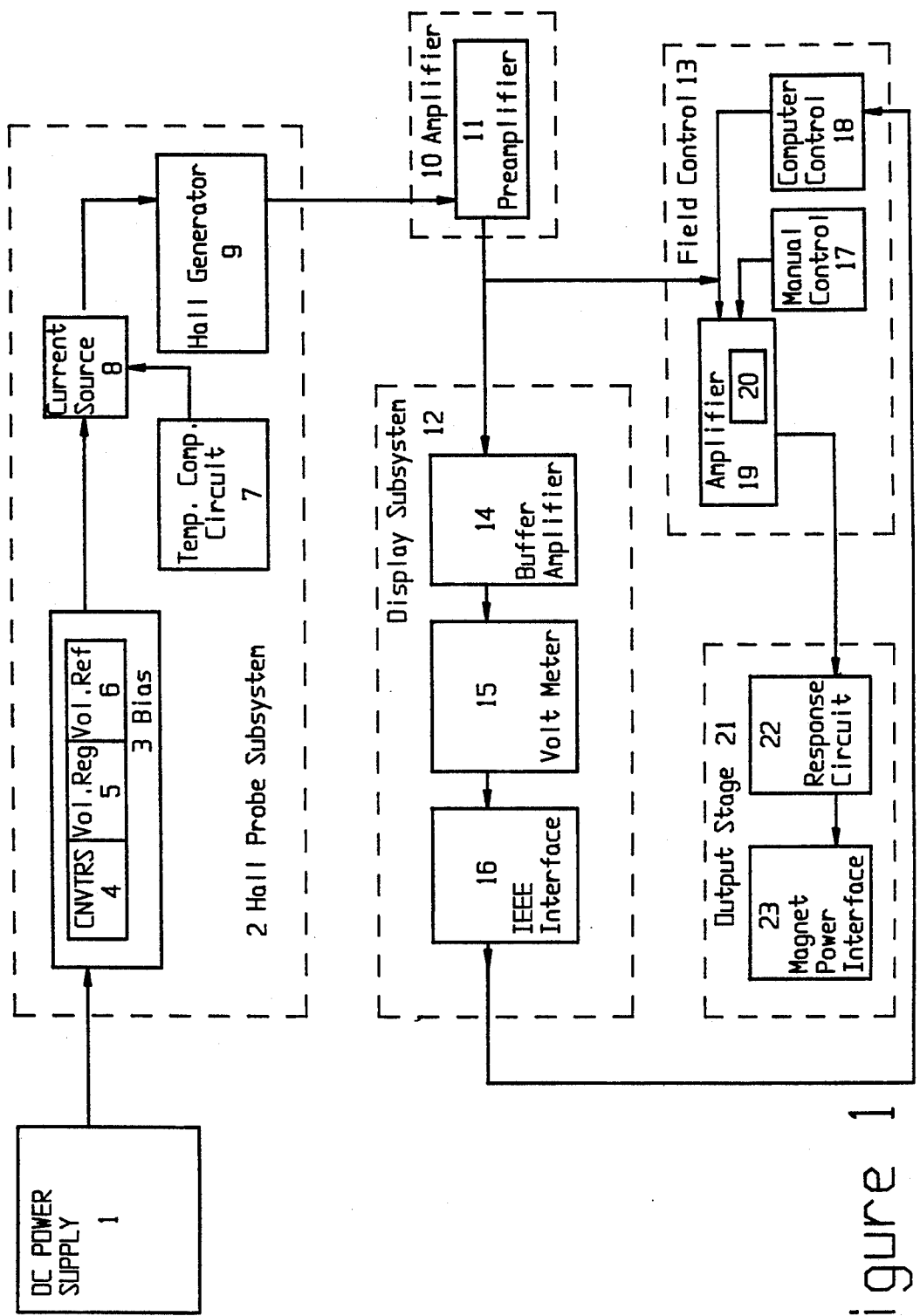
FIG. 1 shows a block diagram of a magnetic field controller.

In FIG. 1 a block diagram of the magnetic field controller is shown. A power supply 1 sends a dc current to the Hall probe subsystem 2. That dc current is received by a biasing means 3, which includes components 4, 5, and 6. The biasing means 3 may include dc-to-dc converters 4, voltage regulators 5, and a precision voltage reference 6. The biasing means 3 along with the temperature compensation circuit 7 provide a constant current source 8 to a Hall effect generator 9. That constant current is received by the Hall effect generator 9, which sends a signal to a suitable preamplifier 10, which includes a chopper stabilized preamplifier 11 to increase the signal strength by using composite amplifiers that combine the superior performance of chopper-stabilized amplifiers with the ultra-low noise of precision bipolar operational amplifiers. The signal is transmitted to the display subsystem 12 and the field control subsystem 13. The Hall probe signal, although dc in nature, has an ac component induced in response to transients in the magnetic field, therefore, the Hall probe bias supply is not isolated from load-to-ground capacitance, which can range up to 0.1 uF, if common dc power supply bias techniques are used. Precipitating reactance and ground loops which cause instability and inaccurate measurements.

The display subsystem 12 receives the signal from the preamplifier 10 and a buffer amplifier 14 is used to buffer the magnet controller feedback loop from the field strength display stage. A digital volt meter 15 reading gauss receives the signal and displays the magnetic field strength. An interface means 16 comprising an IEEE digital interface receives a similar signal, allowing the magnetic field controller while in computer field control mode to set the controller at a predefined field strength and monitor the actual field strength with the digital volt meter 15. The computer system uses a commercially available IEEE-488 interface board. The IEEE link provides a closed-loop magnetic field control and a real-time monitoring system. This allows for a verification that a proper tracking is occurring and that the magnetic field is stable.

The chopper stabilized pre-amplifier 11 also sends a signal to the field control subsystem 13. Precise control of the magnetic field is accomplished by off-setting the balanced feedback loop of the magnet with a reference voltage. The off-setting of the balanced feedback loop is accomplished by setting the controller in either a manual field control mode 17, or computer field control mode 18. In manual field control mode 17 the controller allows for manual adjustment of the reference voltage. In computer field control mode 18 the reference voltage is supplied by an analog converter located within the computer. The computer field control circuitry 18, allows the magnet controller to interface to a data system using an analog signal link. A data system with a Digital-to-Analog Interface (D/A) board provides a precise analog signal which is used to set the desired magnet field strength. In effect, the actual magnetic field, in gauss, is then a direct function of the D/A output voltage. In computer control mode, the D/A board generates an offset reference voltage by using an operational amplifier 20 in the differential summing configuration. When a balanced condition exists between the reference voltage and the signal sent by the chopper stabilized pre-amplifier 11, the differential amplifier 19 goes to a balanced input condition. When the differential amplifier 19 becomes unbalanced, it sends a correcting voltage that is dependant upon the polarity of the error voltage received.

The response time stability circuit 22 of the output stage 21 receives the error voltage from the differential amplifier 19. The response time circuitry 22 allows the controller to operate in either the low or high gain mode from between A switch contained in the frequency response circuitry 22 can be set which allows for two discrete loop gain/response time settings: 1) High Gain Integrator mode and 2) Low Gain Amplifier Mode. The error voltage is then amplified by the magnet power supply interface 23. This provides the required voltage levels for interfacing to the magnet power supply regulator, resulting in a change of magnet current and thus, field strength.

In the description of the preferred embodiment of the invention, a dc based magnetic field controller has been presented for purposes of illustration and description. It is not intended to be exhaustive or to limit the invention to the precise form disclosed, and obviously many modifications and variations are possible in light of the above teaching.

The embodiments of the invention in which an exclusive property or privilege is claimed are defined as follows:

1. An apparatus for the control of a magnetic field comprising:

a dc power supply;

a hall probe subsystem receiving a dc current from said dc power supply and including means for generating a hall effect signal, means for biasing said dc current having a voltage regulator, a precision voltage reference, and a dc-to-dc converter, a temperature compensation circuit, and means for providing a constant current to said means for generating said hall effect signal;

means for amplifying said hall effect signal, having a preamplifier which includes a chopper stabilized preamplifier, said preamplifier adapted to receive said hall effect signal from said hall effect generator and wherein said chopper stabilized preamplifier receiving said hall effect signal and having the ability to further transmit an amplified hall effect signal;

a field control subsystem including means for field control adapted to receive said amplified hall effect signal from said chopper stabilized preamplifier and having the ability to generate a control signal, and said means for field control having a manual field control mode and computer field control mode and wherein while in said computer field control mode of operation said means for field control has the ability to adjust said control signal to compensate for real time monitoring of said magnetic field;

a display subsystem adapted to receive and display said amplified hall effect signal from said chopper stabilized preamplifier, and including an interface means having the ability to receive said amplified hall effect signal, said interface mans including an IEEE interface circuitry having the ability to digitize a magnetic field reading, which allows real time monitoring by said field control subsystem; and an output controller adapted to receive said control signal from said means for field control, ad said output controller including means for stabilizing said control signal, and means for magnetic field interface, said means for magnetic field interface having the ability to adjust said magnetic field in response to said control signal.

2. An apparatus for the control of a magnetic field as recited in claim 1 wherein:
said control signal is an error voltage.

3. An apparatus for the control of a magnetic field as recited in claim 2 wherein:
said means for generating a hall effect signal includes a hall effect generator.

4. An apparatus for the control of a magnetic field as recited in claim 3 wherein:
said display subsystem includes a buffer means having the ability to buffer said display subsystem from feedback, and a digital volt meter receiving and displaying said signal from said chopper stabilized amplifier; and
wherein said interface means has the ability to allow said means for field control to monitor the actual magnetic field strength as displayed from said digital volt meter.

5. An apparatus for the control of a magnetic field as recited in claim 4 wherein:
said field control subsystem includes a differential amplifier;
said computer field control mode having means for recognizing said signals from said preamplifier and said interface means, and having the ability to transmit said control signal to the differential amplifier; and
said manual field control mode having means for manual adjustment of said control signal sent to said differential amplifier.

6. An apparatus for the control of a magnetic field as recited in claim 5 wherein:
said differential amplifier transmits said control signal to said output controller.

7. An apparatus for the control of a magnetic field as recited in claim 6 wherein:
said means for magnetic field interface includes means for regulating voltage to said power supply.

* * * * *